United States Patent [19]

Ershov

[11] Patent Number: 5,901,163
[45] Date of Patent: May 4, 1999

[54] NARROW BAND LASER WITH ETALON BASED OUTPUT COUPLER

[75] Inventor: Alexander I. Ershov, San Diego, Calif.

[73] Assignee: Cymer, Inc., San Diego, Calif.

[21] Appl. No.: 08/987,127

[22] Filed: Dec. 8, 1997

Related U.S. Application Data

[63] Continuation-in-part of application No. 08/869,239, Jun. 4, 1997, application No. 08/886,715, Jul. 1, 1997, and application No. 08/926,721, Sep. 10, 1997.

[51] Int. Cl.$^6$ ....................................................... H01S 3/10
[52] U.S. Cl. .................................. 372/20; 372/19; 372/57; 372/102; 372/100
[58] Field of Search .................................. 372/20, 19, 57, 372/102, 100, 95, 32

[56] References Cited

U.S. PATENT DOCUMENTS

| | | | |
|---|---|---|---|
| 4,803,696 | 2/1989 | Pepper et al. | 372/95 |
| 4,868,515 | 9/1989 | Reintjes et al. | 372/95 |
| 4,947,398 | 8/1990 | Yasuda et al. | 372/32 |
| 5,012,483 | 4/1991 | Reintjes et al. | 372/95 |
| 5,043,998 | 8/1991 | Cooper et al. | 372/95 |
| 5,095,482 | 3/1992 | Sandstrom | 372/29 |
| 5,095,487 | 3/1992 | Meyerhofer et al. | 372/102 |
| 5,095,492 | 3/1992 | Sandstrom | 372/102 |
| 5,150,370 | 9/1992 | Furuya et al. | 372/106 |
| 5,327,449 | 7/1994 | Du et al. | 372/95 |
| 5,559,816 | 9/1996 | Basting et al. | 372/27 |

OTHER PUBLICATIONS

Loree, et al., "Spectral tuning of ArF and KrF discharge lasers", Appl. Phys. Lett. 32(3), Feb. 1, 1978, pp. 171–173.

Littman and Metcalf "Spectrally narrow pulsed dye laser without beam expander", Applied Optics, vol. 17, No. 14, Jul. 15, 1978, pp. 2224–2227.

Trebino, et al., "A Comparison of the Cassegrain and Other Beam Expanders in High–Power Pulsed Dye Lasers", IEEE Journal of Quantum Electronics, vol. QE, 18(8), pp. 1208–1213, Aug. 1982.

Duarte and Piper, "Comparison of prism–expander and grazing incidence grating cavities for copper laser pumped dye lasers", Applied Optics, vol. 21, No. 15, Aug. 1, 1982, pp. 2782–2786.

Reintjes, "Coherent Ultraviolet and Vacuum Ultraviolet Sources", in Laser Handbook, vol. 5, Edited by Bass and Stitch (North–Holland:Elsevier, 1985); pp. 44–50.

Magni, et al., "Resonators with Variable Reflectivity Mirrors", in The Physics and Technology Laser Resonators, (Bristol and New York: Hilger 1989), pp. 94–105.

Shaw, "Excimer Laser Resonators", in The Physics and Technology of Laser Resonators, (Bristol and New York: Hilger 1989), pp. 237–245.

Sengupta, "Krypton fluoride excimer laser for advanced microlithography", Optical Engineering, vol. 32, No. 10, Oct. 1993, pp. 2410–2420.

Giuri, et al., "Output coupler design of unstable cavities for excimer lasers", Applied Optics, vol. 26, No. 6, Feb. 20, 1997, pp. 1143–1148.

*Primary Examiner*—Leon Scott, Jr.
*Attorney, Agent, or Firm*—John R. Ross, Esq.

[57] ABSTRACT

A line narrowed laser having a grating based line narrowing module and etalon-based line narrowing output coupler and a technique for tuning the laser. The etalon based output coupler is adjusted to preferentially reflect light at or near the spectral maximum produced by the grating. Substantial improvement in line narrowing results from the amplification in the laser resonance chamber of light at or near the grating spectral maximum which is preferentially reflected by the etalon based output coupler. A special tuning technique takes advantage of the fact that a grating based line narrowing module naturally produces a laser beam having spacial variation in wavelength along a beam cross sectional direction. By comparing profiles of the beam into and out of the etalon in the output coupler, the grating and/or the etalon can be adjusted to achieve desired spectral performance.

26 Claims, 10 Drawing Sheets

FIG. 10

NARROW BAND LASER WITH ETALON BASED OUTPUT COUPLER

This application is a continuation-in-part application of U.S. Ser. No. 08/869,239, filed Jun. 4, 1997; U.S. Ser. No. 08/886,715, filed Jul. 1, 1997; and U.S. Ser. No. 08/926,721, filed Sep. 10, 1997. This invention relates to line narrowed lasers and especially to grating and etalon-based line narrowed excimer lasers.

BACKGROUND OF THE INVENTION

Techniques for Line Narrowing

Techniques for decreasing the bandwidth of the output of lasers are well known. Several such techniques used on excimer lasers are discussed by John F. Reintjes at pages 44–50 in *Laser Handbook*, Vol. 5, North-Holland Physics Publishing, Elsevier Science Publishers B. V. These techniques include the utilization of gratings, including echelle gratings for wavelength selection. Use of beam expanding prisms ahead of the grating can increase the effectiveness of the grating.

Figure 1:
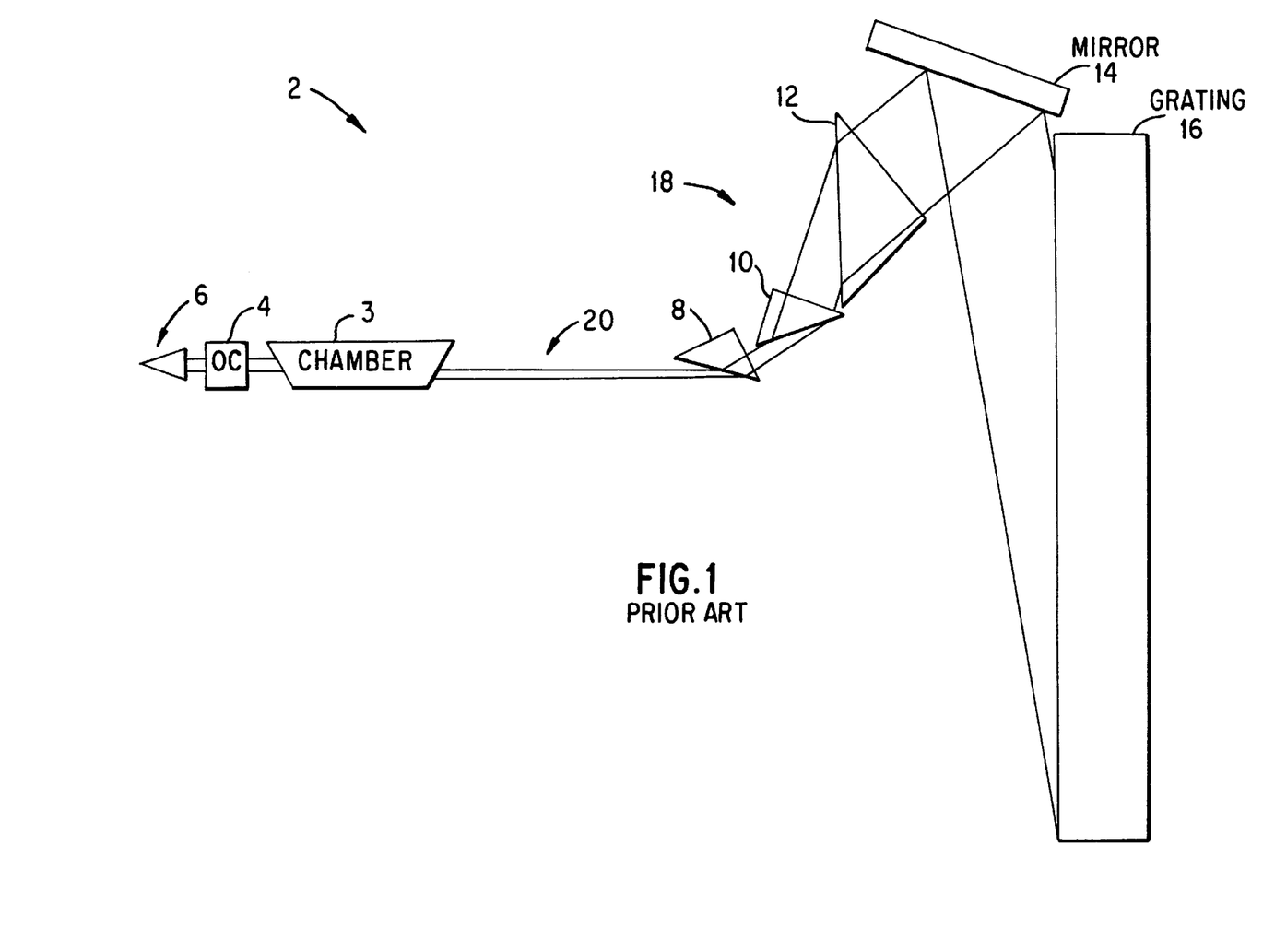
FIG. 1 shows a prior art line-narrowed laser.

A prior art narrow band KrF excimer laser is shown in FIG. 1. The resonance cavity of excimer laser 2 is formed by output coupler 4 (which is a 10 percent partially reflecting mirror) and echelle grating 16. A portion of the laser output beam 20 (having a cross section of about 3 mm in the horizonal direction and 20 mm in the vertical direction) exits the rear of laser chamber 3. This portion of the beam is expanded in the horizonal direction by prisms 8, 10 and 12 and reflected by mirror 14 onto echelle grating 16. Mirror 14 is pivoted to select the narrow band output for laser 2. Grating 16 is arranged in Littrow configuration so that the selected narrow band of wavelengths is reflected back off mirror 14 and back through prisms 12, 10 and 8 and into chamber 3 for amplification. Light at wavelengths outside the selected narrow band is disbursed so that this disbursed out-of-band light is not reflected back into the laser chamber. Typical KrF lasers operating in a pulse mode may have a cavity length of about 1 m and produce pulses having a duration of about 15 to 25 ns. Thus, photons within the resonance cavity will make, on the average, about 3 to 5 round trips within the cavity. On each round trip, about 90 percent of the beam exits at the output coupler and about 10 percent is sent back for further amplification and line narrowing. The beam is repeatedly line narrowed as it passes through the line narrowing module.

With this prior art arrangement, the bandwidth of the KrF laser is reduced from its natural bandwidth of about 300 pm (full width half maximum or FWHM) to about 0.8 pm.

Another important measure of the pulse quality is referred to as the "95% integral". This is the spectral width of the portion of the pulse containing 95% of the pulse energy. This prior art KrF laser can provide "95% intergral" values of around 3 pm over the lifetime of the laser.

Some applications of KrF lasers, however, require greater narrowing of the bandwidth. One such application is 248 nm micro-lithography where, in order to achieve a resolution of <0.25µ, a laser bandwidth of <0.6 pm, (FWHM) and "95% integral" value of <1.5÷2.0 pm are required.

Figure 2:
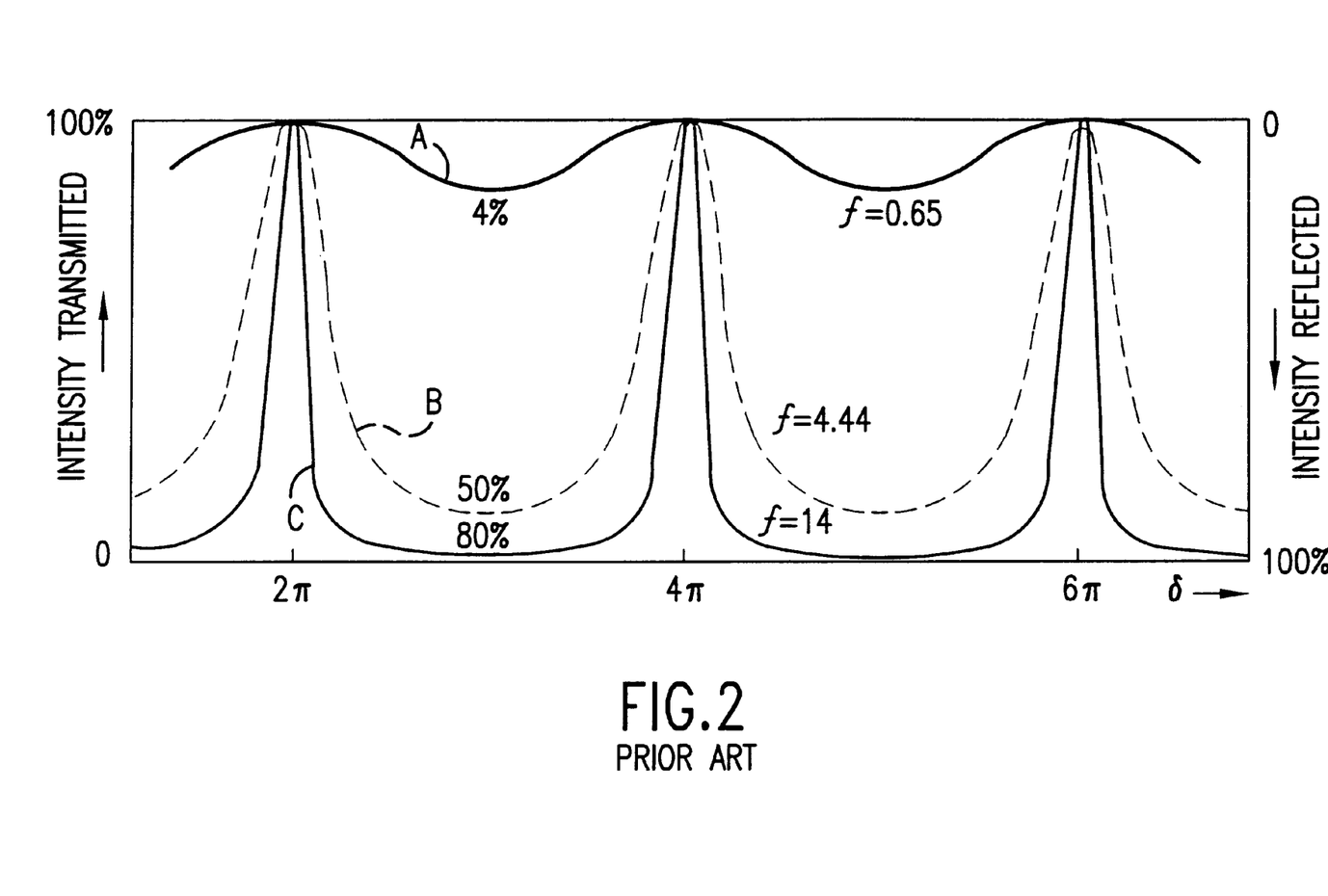
FIG. 2 shows the percent of light transmitted by an etalon as a function of the reflectance of the two inner etalon surfaces.

One prior art method is to add an etalon within the resonance cavity. In this case, the etalon is operated in a transmissive mode and the light is additionally line narrowed as it passes through the etalon. In such system one should use a relatively high finesse etalon, with a finesse value f of about 1 or higher which produces sharp fringe patterns. The finesse value f is determined by the equation:

$$f = \pi r^{1/2}/(1-r)$$

where r is the reflectivity of the etalon surfaces. The dependence of etalon tranmission spectrum on r is shown graphically in FIG. 2 which is extracted from page 208 of *Fundamentals of Optics* by Jenkins and White, published by McGraw Hill. From FIG. 2, it is obvious why prior art transmissive etalons used for line narrowing have surfaces with reflectance of about 50% to 80% (see curves B and C of FIG. 2). FIG. 2 also shows that it would not be practical to use curve A-type low finesse etalon as it line-narrowing efficiency in this prior art arrangement would be very low. Prior art light finesse etalons used with diffraction gratings should enhance the line-narrowing capabilities provided by diffraction grating, and in general, improves the laser linewidth. The major disadvantages of this technique are that the many reflections within the etalon tend to heat up the etalon producing distortions and that the tuning of the etalon synchronously with the grating does present a real technical challenge and is difficult to accomplish in practice.

What is needed is a better technique for line narrowing and tuning of lasers.

SUMMARY OF THE INVENTION

The present invention provides a line narrowed laser having a grating based line narrowing module, etalon-based line narrowing output coupler and a technique for tuning the laser. The etalon based output coupler is adjusted to preferentially reflect light at or near the spectral maximum produced by the grating. Substantial improvement in line narrowing results from the amplification in the laser resonance chamber of light at or near the grating spectral maximum which is preferentially reflected by the etalon based output coupler. A special tuning technique takes advantage of the fact that a grating based line narrowing module naturally produces a laser beam having spacial variation in wavelength along a beam cross sectional direction. By comparing profiles of the beam into and out of the etalon in the output coupler, the grating and/or the etalon can be adjusted to achieve desired spectral performance. In a preferred embodiment, the technique is based on a sampling of light reflected from the etalon and the output light of the laser. An etalon error signal is generated by comparing beam profile of the reflected light and output light and measuring relative displacement between the two profiles. This allows the position of the etalon spectral maximum to be tuned to the position of spectral maximum established by the grating to a very high accuracy. The position of the grating spectral maximum is determined based on the spectral measurement of the laser output or it can be selected within the laser spectral range by the laser operator.

DETAILED DESCRIPTION OF THE PREFERRED EMBODIMENTS

A very narrow-band KrF laser utilizing the features of the present invention is described below:

The Chamber

Figure 3A:
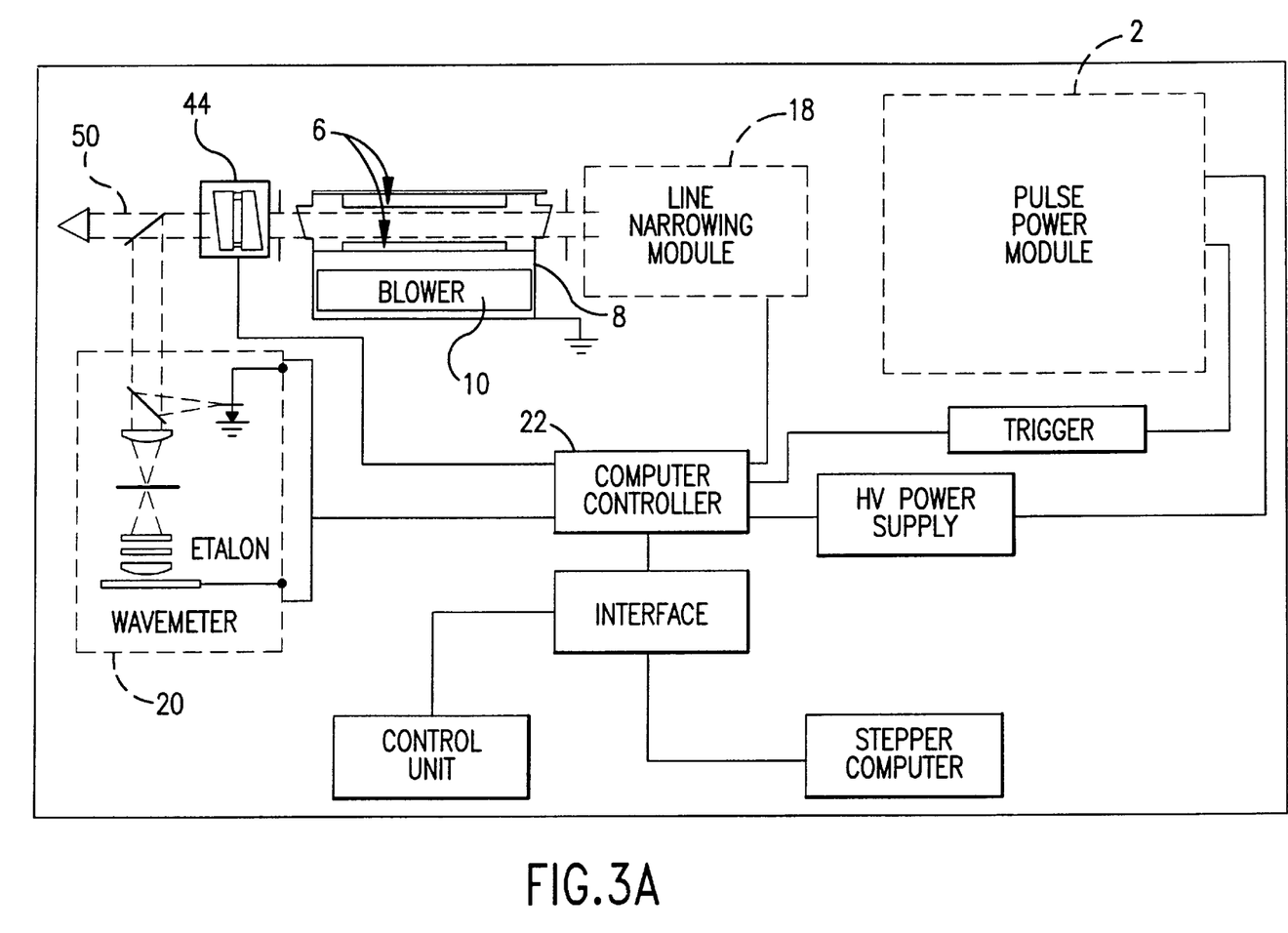
FIG. 3A shows a line narrowed excimer laser with etalon output coupler.

The discharge chamber 8 of a preferred embodiment of the present invention, shown in FIG. 3A, is the same as prior art discharge chambers. The chamber 8 is a vessel, designed to hold several atmospheres of corrosive gases. A discharge region is defined by the two electrodes 6 separated by a gap of 1.2 to 2.5 cm. The cathode is supported by an insulating structure since it is connected to the high voltage, while the anode is attached to the metal chamber which is at ground potential. Preionization is done by corona discharge preionizers located on either side of the discharge region. Due to the corrosive nature of the laser gas, the chambers use particular metals chosen to resist fluorine attack. The fluorine gas however, still reacts with the chamber internal parts such as chamber walls and electrodes, thus consuming fluorine and generating metal fluoride contaminants. Metal fluoride dust is trapped by means of an electrostatic precipitator not shown. A small amount of laser gas is extracted from the chamber and is passed over negatively charged high field wires to trap the dust. The dust-free gas is then released over the windows to keep them clean.

Pulse Power Module

Figure 3B:
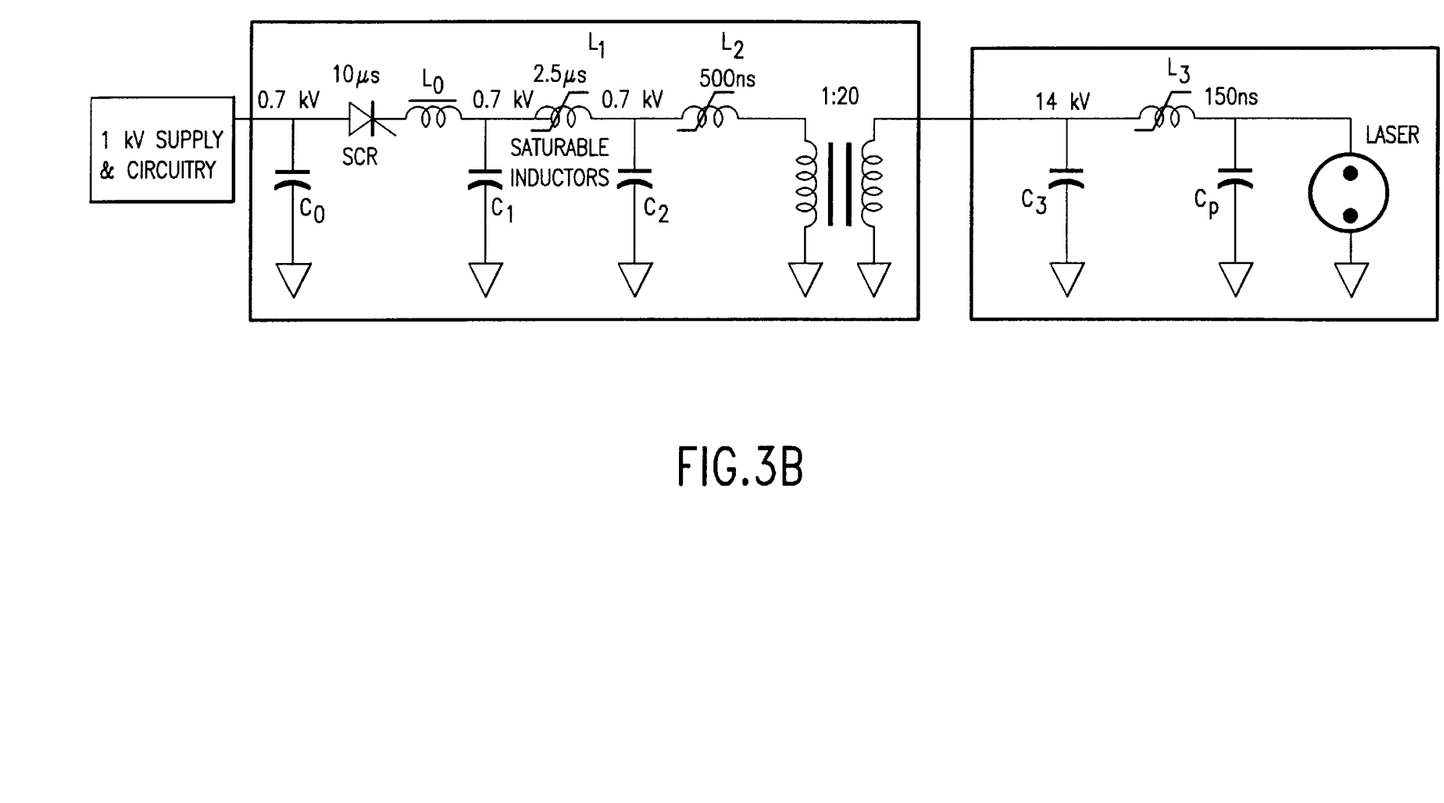
FIG. 3B shows a solid state pulse power module used by the FIG. 3A laser.

This preferred embodiment utilizes a solid state pulsed power module (SSPPM) circuit shown in FIG. 3B. It switches the energy of capacitor $C_0$ charged by a 1 kV power supply into a pulse compression circuit formed by capacitors $C_1$, $C_2$, $C_3$, a step-up transformer, and three saturable inductors $L_1$, $L_2$ and $L_3$. The operation of this circuit is as follows. The DC charge stored on $C_0$ is switched through the SCR and the inductor $L_0$ into $C_1$. The saturable inductor, $L_1$, holds off the voltage on $C_1$ for approximately 2.5 $\mu$s and then becomes conducting, allowing the transfer of charge from $C_1$ to $C_2$. The second saturable inductor, $L_2$, holds off the voltage on $C_2$ for approximately 500 ns and then allows the charge on $C_2$ to flow through the primary of 1:20 step-up transformer. The output from the step-up transformer is stored on $C_3$ until the saturable inductor $L_3$ becomes conducting in approximately 100–150 ns. The charge is then finally transferred through $L_3$ into $C_p$ and laser discharge occurs.

Spectral Narrowing

Spectral narrowing of a KrF laser is complicated by its short pulse duration (15 to 25 ns, FWHM) and UV wavelength. The short pulse results in very high intra-cavity power (~1 MW/cm$^2$), and the short wavelength can thermally distort optical materials due to their high absorption co-efficient at 248 nm. Also, the total number of round trips through the resonator (which includes the line narrowing optical elements) for a typical laser is small, about 3 to 5. If the single pass line width through the resonator is denoted by $\Delta\lambda_1$, then an estimate of the final line width $\Delta\lambda_f$ after n passes is given by:

$$\Delta\lambda_f = \frac{\Delta\lambda_1}{\sqrt{n}} \tag{1}$$

Therefore, the single pass line width of the optical system is only about a factor of two higher than the final line width. Therefore, the efficiency of converting the broadband spectrum to line narrowed spectrum (i.e. from 300 pm to <1 pm) of the optical system must be very high.

Figure 5:
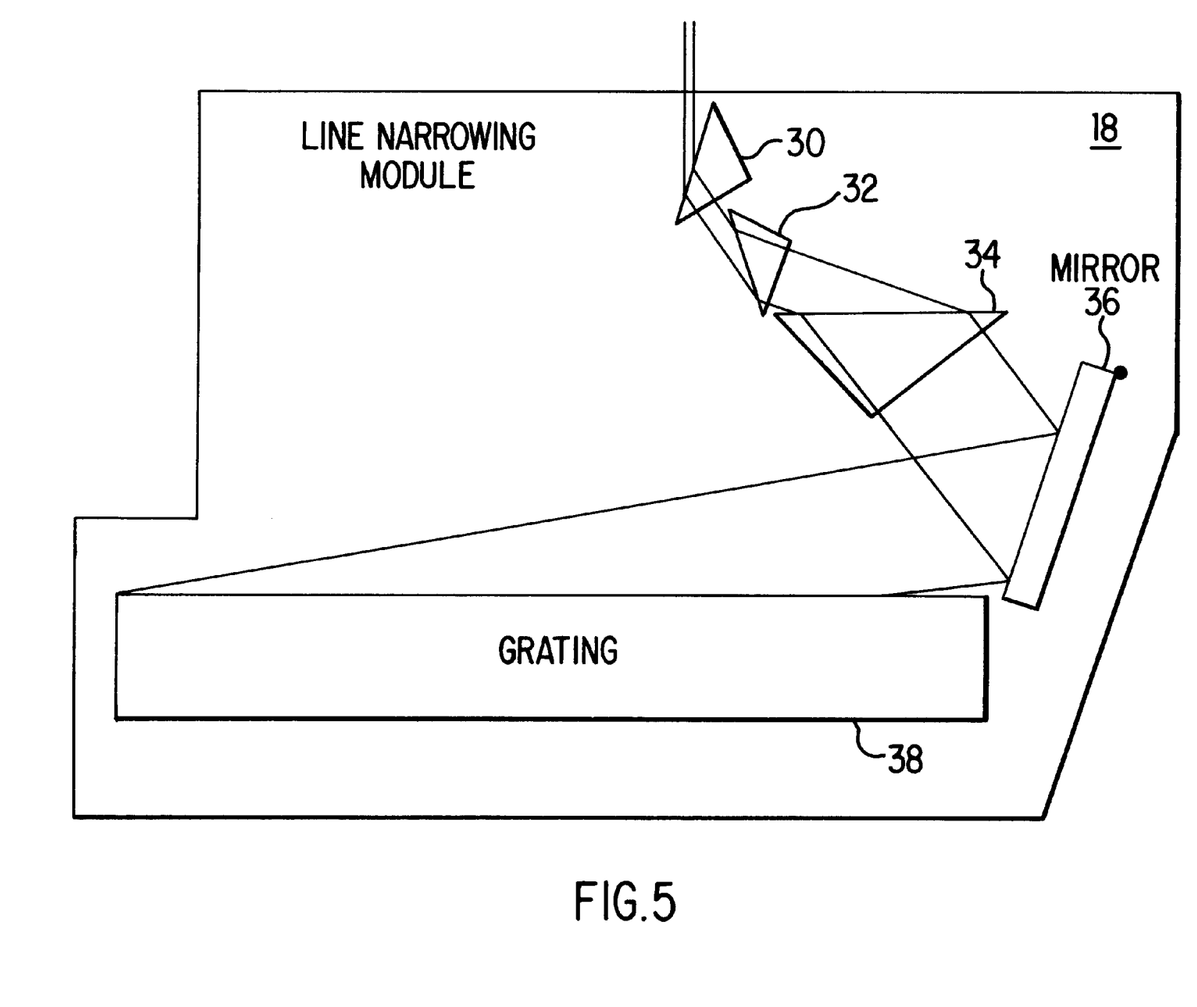
FIG. 5 shows a diffraction grating-based line-narrowing module.

The common technique of line-narrowing the KrF laser is by introducing wavelength dispersive optical elements in the resonator. Three types of dispersive elements can be used: prisms, etalons and gratings. The use of a high dispersive grating in a Littrow configuration has been the most effective spectral line narrowing technique. Because the grating is a dispersive element, to get a narrow line-width, the laser beam should have a small divergence where the beam illuminates the grating. Three prisms beam expanders 30, 32 and 34 as shown in FIG. 5 are inserted in the line narrowing module in order to expand the beam and thus reduce its divergence. Two apertures at both ends of the laser (not shown) are used to further reduce divergence.

The principal elements of a preferred line narrowing module are shown in FIG. 5. These include three prisms 30, 32 and 34, a tuning mirror 36, and an eschelle grating 38. The mirror is pivoted to select the wavelength of the laser. When this line-narrowing module 18 is used as the only line selecting module, the linewidth of KrF laser can be reduced to about 0.8 pm (FWHM) and 3.0 pm (95%).

Tunable Etalon as Output Coupler

The use of the etalon output coupler 44 permits further reduction of the bandwidth of the laser.

A tunable etalon is an etalon, the free spectral range (FSR) of which can be adjusted.

FSR is determined by:

$$FSR = \frac{\lambda^2}{2nd} \tag{2}$$

where:

n=refractive index of the gas in the gap d=size of the gap, and $\lambda$=wavelength.

Commercially available tunable etalons consist of two parallel plates with a space between them. That space is filled with air, nitrogen, or other suitable gas. The FSR can be changed by either changing the size of air space gap, or changing the gas pressure in the gap, and thus changing refractive index n in formula (2).

Figure 6:
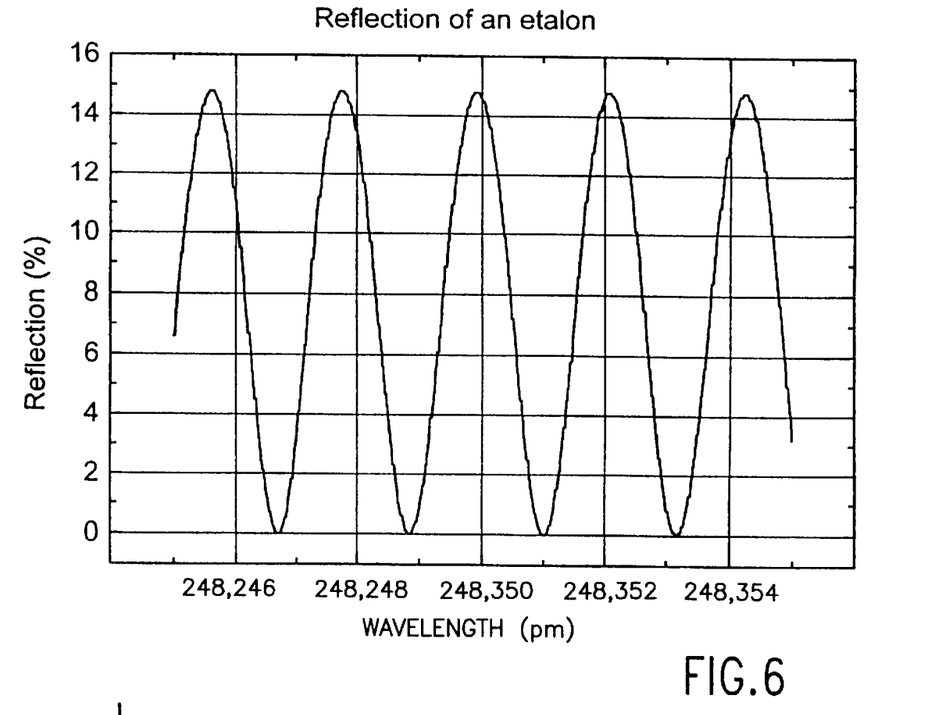
FIG. 6 shows a reflectivity of the etalon OC in dependence on wavelength.
Figure 7:
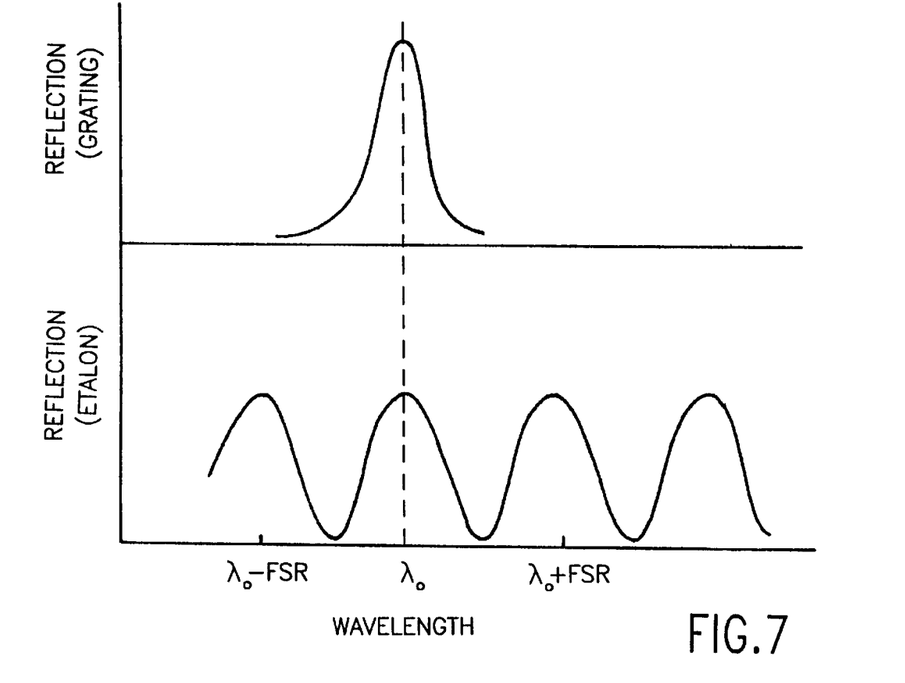
FIG. 7 shows relative positions of maximum reflectivity for line-narrowing module and etalon OC.

The preferred etalon output coupler has a reflectivity of the plates of about 4%. In this embodiment, the gas is nitrogen with an n of 1.0003. The gap size is about 15 mm and the wavelength is about 248 nm. In this case, the total reflectivity of the etalon is determined by an interference of the light waves, reflected from both parallel surfaces and is shown in FIG. 6 as a function of wavelength. For comparison, a curve A in FIG. 2 shows transmission of the same etalon. The minimum reflection is about 0% and the maximum is about 15%. If one of the reflection peaks is matched to the grating maximum, then about 15% of the light at the grating maximum is reflected (85% is transmitted). Portions of the beam which are higher or lower in wavelength than the grating maximum by about 1 pm are not reflected at all. Light which deviates from the grating maximum by about 2 pm would be reflected at about 15%. However, the grating is effective in controlling about 95% of the light to within about 1.5 pm of the grating maximum. Therefore, for the best line-narrowing, one of the maximums of the etalon reflection should be at the same wavelength as the maximum reflection of the grating in line narrowing module as shown in FIG. 7. In this case, the laser will generate at the central wavelength $\lambda_0$, and it will have the minimum line-width as wavelength selection effects of the etalon adds to the wavelength selection effects of the grating. When the laser wavelength needs to be changed, the mirror 36 is tuned at the different angle, thus moving the maximum of diffraction grating reflection to a different $\lambda_0'$. The etalon output coupler then needs to be tuned also, so that the new center wavelength $\lambda_0'$ coincides with one of the etalon maximums.

The reader should understand that this etalon is considerably different from the more conventional "transmissive" etalon. In the latter case, the reflectivity of the parallel plates is chosen between 20% and 99% of the light, and the line-narrowing is done for the transmitted light through the etalon. The multiple reflections (about 5 to 50) of the light between the parallel plates greatly increases the light intensity inside the etalon, thus causing a number of serious problems when high power laser operation is required. Such problems include, for example, thermal distortions of the beam, failure of the reflective coatings, etc. All these problems are insignificant in the etalon output coupler of the present invention because there is no multiple reflection of the light between the parallel plates. Instead, essentially single reflection from one plate interferes with a single reflection from the other plate.

Preferred Technique for Aligning the Etalon for Required Wavelength

Figure 9A:
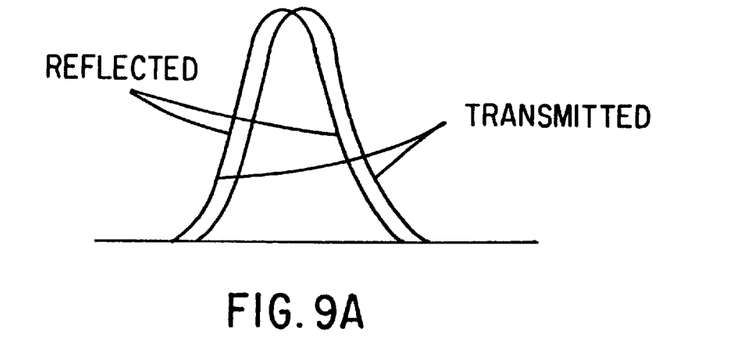
FIGS. 9A–9C show the reflected and transmitted beams through an etalon output coupler.
Figure 9B:
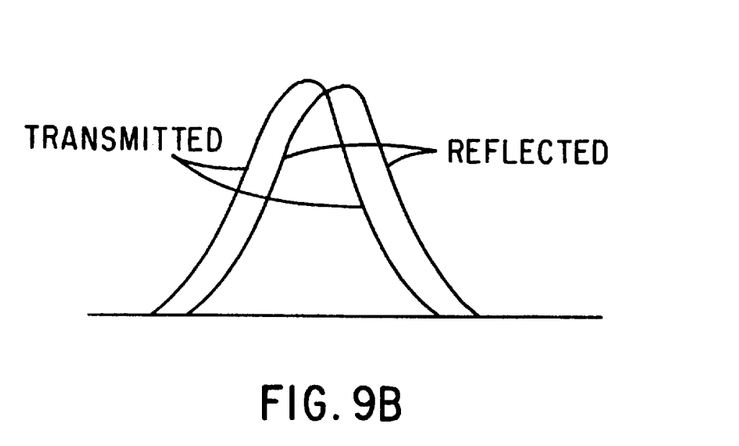
Figure 9C:
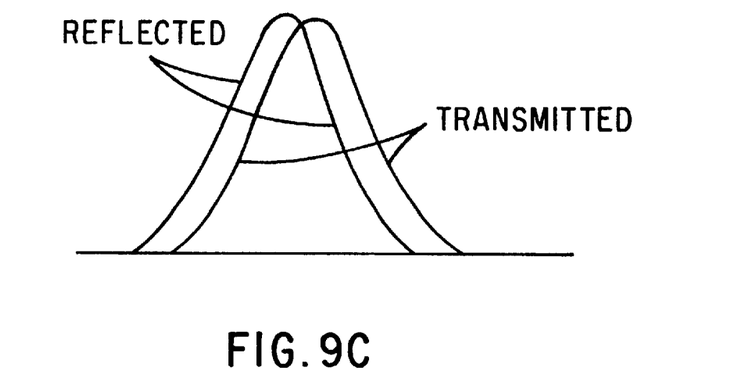
Figure 10:
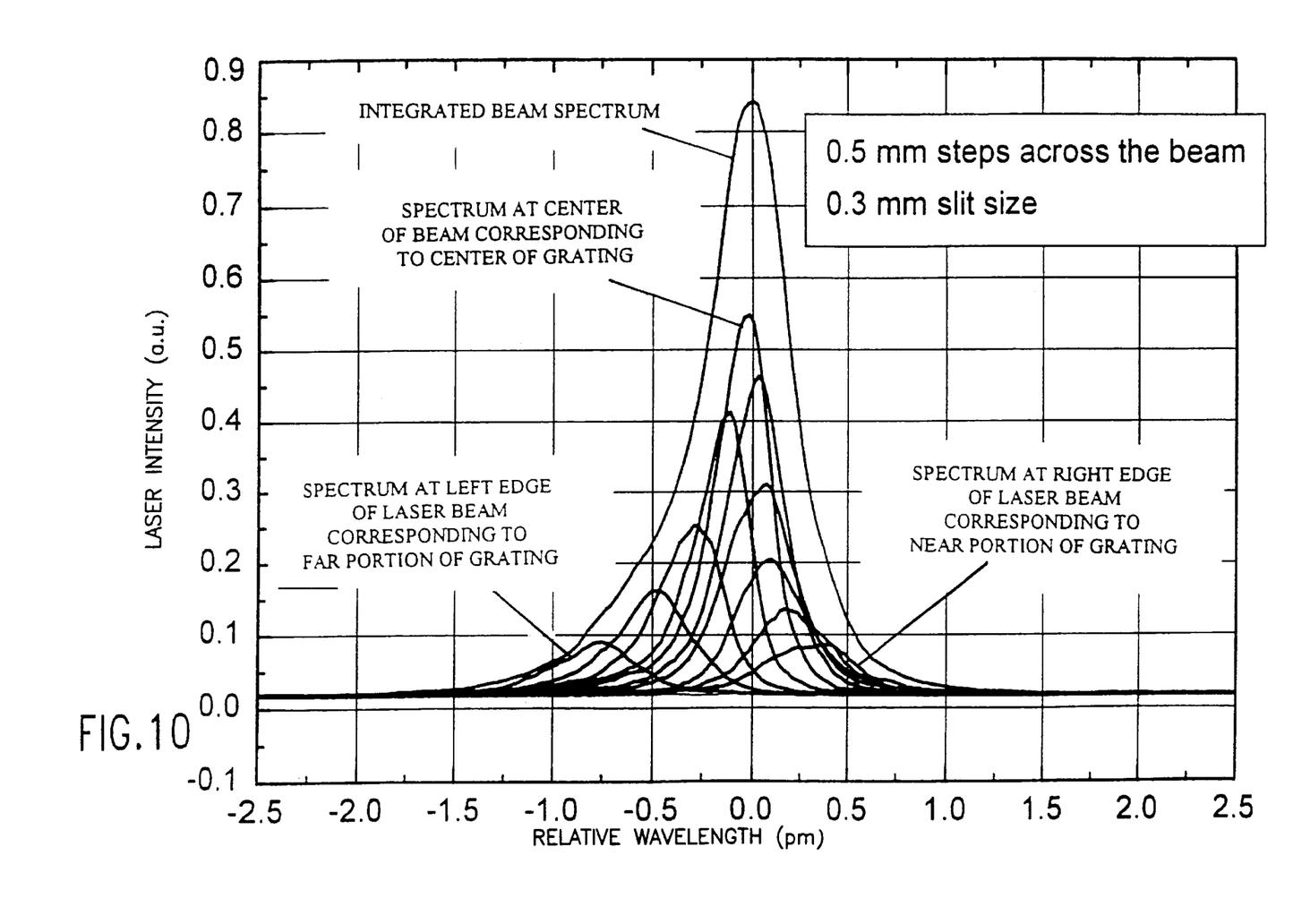
FIG. 10 shows the spatial distribution of the laser spectrum.

The preferred technique for tuning etalon is shown by reference to FIGS. 4, 9A, 9B, 9C and 10. FIG. 10 shows the distribution of the laser spectrum across the output beam of laser 2 when line narrowed by line narrowing module 18. Each curve is a spectrum of the laser light when only small vertical slice of the beam is cut. One can see, that the spectrum of the left side of the beam is shifted towards smaller wavelengths, while the spectrum of the right side of the beam is shifted toward larger wavelengths.

Figure 4:
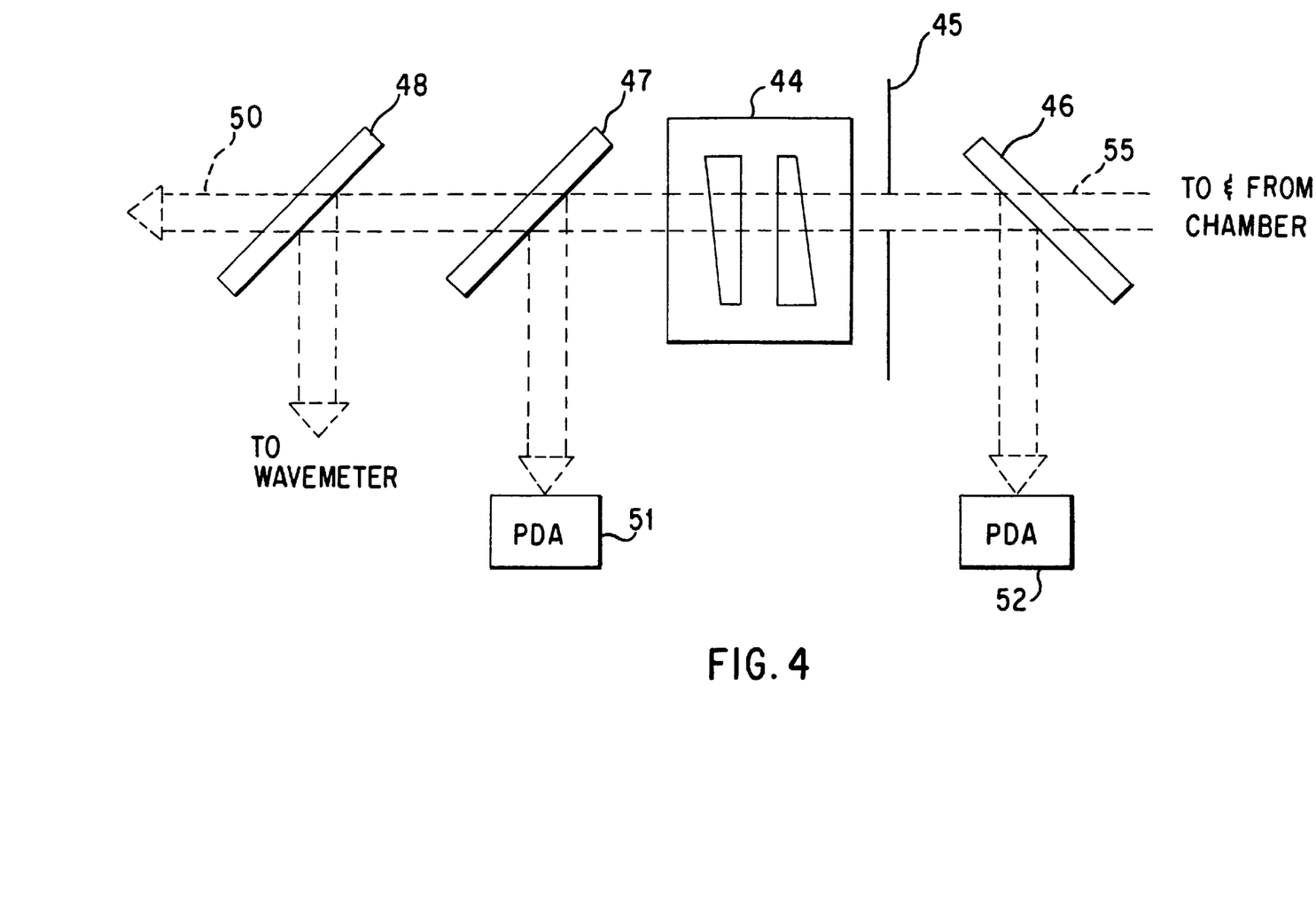
FIG. 4 shows some features of an etalon output coupler of a preferred embodiment of the present invention.

FIG. 4 shows the elements of a preferred output coupler. The output coupler comprises etalon 44, aperture 45 and three partially reflecting mirrors 46, 47 and 48, each of them reflecting less than 1% of the light. The light 55 coming from the chamber goes through the partially reflecting mirror 46 and through the aperture 45. Aperture 45 determines the output size of the beam and in the preferred embodiment is about 3.5 mm×16 mm. Then the light hits the etalon output coupler 44. Spectrally line-narrowed light is reflected from the etalon back to the laser chamber for further amplification. Small portion of that light is reflected by partial reflector 46 and directed to photo-diode array 52. The photodiode array is positioned to measure the horizontal beam profile. Here and everywhere in this patent we assume the vertical plane is the plane passing through both the cathode and the anode of the laser, and the horizontal plane is perpendicular to it.

The rest of the light goes through the etalon and is shown as 50. Small portion of that light is reflected by partial reflectors 47 and 48. Partially reflected mirror 47 reflects less than 1% of the light to the photo diode array 51. This array 51 measures the horizontal beam profile of the transmitted light. The information on transmitted and reflected beam profiles is transmitted from arrays 51 and 52 to the computer controller 22 (FIG. 3A). This controller measures relative position of reflected and transmitted profiles. FIG. 9 shows three different situations. FIG. 9A is when the etalon is tuned to the same wavelength $\lambda$ as the grating. FIGS. 9B and 9C show the situation when there is a small misalignment between the etalon and diffraction grating. One can see that small misalignment causes shift of the reflected beam profile relative to transmitted beam profile. In FIG. 9 the shift of reflected light to the right is when the maximum of the etalon is at a slightly larger wavelength then the maximum of the grating. The shift of reflected light to the left is when the maximum of the etalon is at a slightly smaller wavelength.

These beam profiles are analyzed by a computer controller 22, and the error correction signal is generated. In the situation of FIG. 9B, it generates the correction signal to reduce the optical length between the plates of the etalon, and in the situation of FIG. 9C it generates the correction signal to increase the optical length. The author of the present invention used a pressure tuned etalon with a space between the plates of about 15 mm to spectrally line-narrowed KrF excimer laser. The detection technique of the present invention was capable of detecting the misalignment of the grating and the etalon to better than 0.1 pm which satisfies the requirements for micro-lithography. The minimum pressure adjustment used was about 0.5 Torr, which shifts the etalon to about 0.05 pm. Very stable operation of the laser with a bandwidth of less than 0.4 pm (FWHM) and 1.0 pm (95% integral) was achieved. The position of the laser center wavelength was controlled by using a wavemeter 20 which measures the absolute wavelength of the emitted light and this value is used by computer controller 22 to position the reflecting mirror 36 in the line-narrowing module (FIG. 7). Thus the tuning of the laser was done in a "master-slave" mode, where the master control of the central wavelength was done by a mirror 36 (FIG. 7), and the 'slave' control of the etalon was done based on optimizing beam profiles of reflected and transmitted beams.

When such a beam as is shown in FIG. 10 hits the etalon, the left and right portions of the beam will be reflected depending on the tuning of the etalon. If the etalon is tuned correctly, then the maximum reflectivity will be for the central part of the beam, which has a wavelength close to central wavelength $\lambda$ of the laser. The left and right parts of the beam will have their wavelengths detuned slightly from the center, so they will have somewhat smaller reflection from the etalon. That reduction of the reflection is about the same for both left and right sides of the beam, so there is no overall shift of the reflected beam profile. On the other side, when the etalon detuned slightly, the center part of the beam would have small detuning from the maximum position of the etalon. One side (for example, left) would have even larger detuning, but the other side (right) would be right at the etalon maximum position. Therefore, the right side would have the maximum reflection, the center would have smaller reflection, and the left side would have the smallest reflection. This will effectively shift the reflected beam profile to the right.

On the other hand, the shift in the output beam of the laser is rather small as it was experimentally observed. This can be understood, if one remembers, that in transmitted light, the relative difference between the maximum and the minimum is very small, as the maximum is 100%, and the minimum is 85%, while in reflected light the relative difference is much larger, as the maximum is 15%, but the minimum is 0%.

Figure 8:
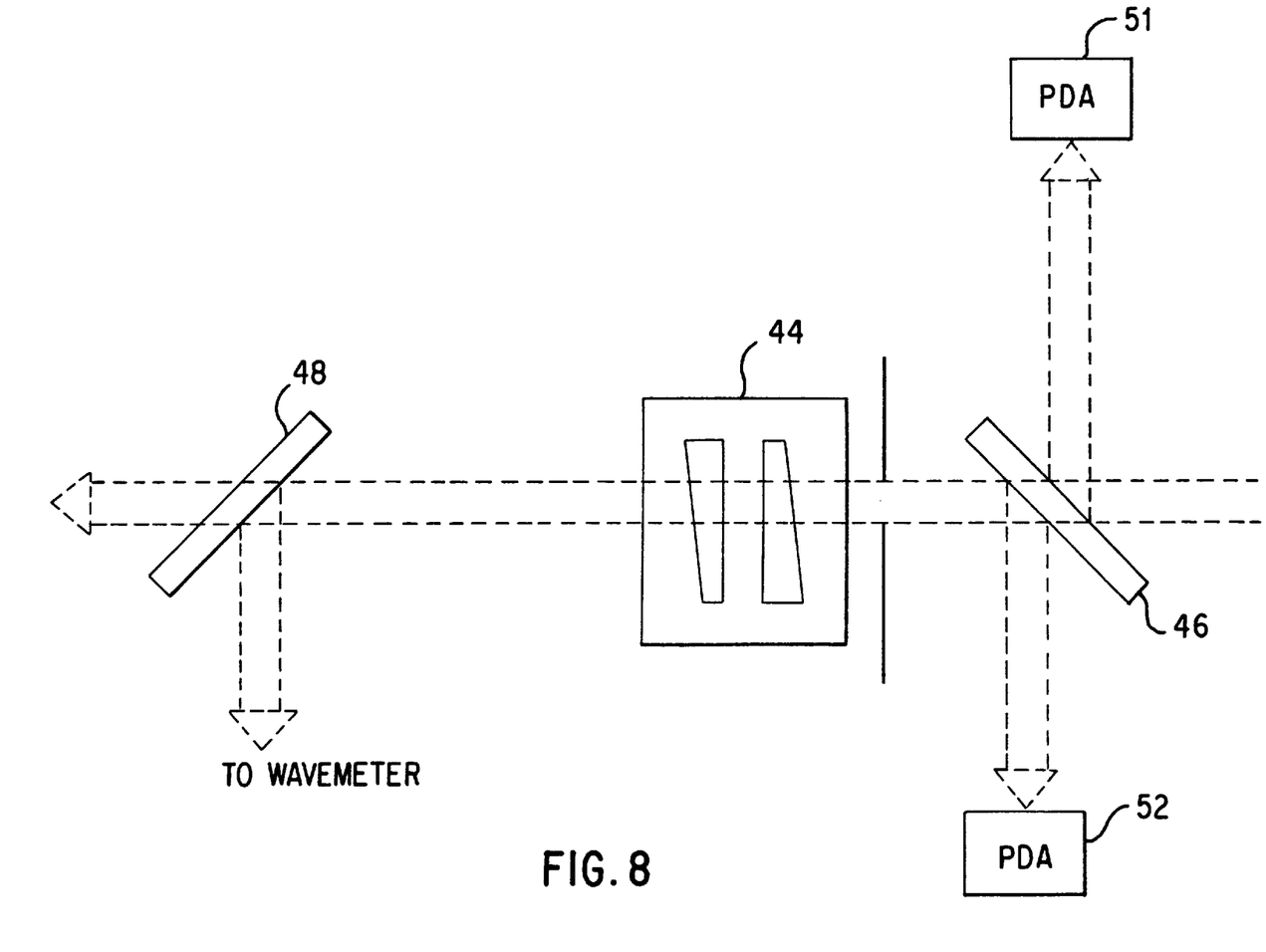
FIG. 8 shows the second preferred embodiment of the present invention.

FIG. 8 shows a second preferred embodiment of the present invention. In this embodiment, a single partially reflecting mirror 46 is used to collect a small portion of the incident light on the etalon as well as reflected spectrally line-narrowed light. In this embodiment, the beam profiles of the incident and reflected beams are compared rather than transmitted and reflected beams. The rest of the technique is similar to the first preferred embodiment.

Although this very narrow band laser has been described with reference to a particular embodiment, it is to be appreciated that various adaptations and modifications may be made. For example, the techniques described for use on a KrF laser which operates at a nominal wavelength can also be applied to ArF lasers; however, the optics must be designed for 193 nm. In addition, to pressure-tuned etalons and piezoelectric-tuned etalons, there are commercially available etalons which are compression-tuned using mechanical force to widen or narrow the gap between the plates of the etalon. Etalons with reflectances other than 4% could be used. Preferably, however, the reflectance of the reflecting surfaces should be between about 2 and about 20%. Persons skilled in the art will recognize that the grating based line narrowing module described above could be replaced with many other prior art line narrowing modules, such as modules comprised of a plurality of prisms and a totally reflecting mirror, a diffraction grating without beam expanders, and a diffraction grating and a totally reflecting mirror. Transmissive etalons could also be included in the line narrowing module. Therefore, the invention is only to be limited by the appended claims.

That which is claimed is:

1. A very narrow band laser comprising:
   A. a laser chamber containing a gain medium,
   B. a line-narrowing unit positioned to accept a portion of the light generated in the laser chamber, narrow its spectrum to produce line-narrowed light in a desired narrow wavelength range, and return it to the laser chamber,
   C. an output coupler comprising an etalon, said output coupler being configured to operate in a reflective mode:
      1) to provide a maximum reflection, back into the laser chamber, at a wavelength within said desired narrow wavelength range,
      2) to transmit substantially all light at wavelengths immediately above and immediately below said desired narrow wavelength range, and
      3) to transmit a substantial portion of light within said desired narrow wavelength range.

2. A laser as in claim 1 wherein said line narrowing unit is comprised of:
   A. at least one beam expanding prism;
   B. a grating; and
   C. a grating tuning means for tuning the grating.

3. A laser as in claim 2 and further comprising a wavemeter and a wavelength controller for controlling the grating tuning means.

4. A laser as in claim 3 and further comprising an etalon tuning means.

5. A laser as in claim 2 wherein both the grating and the etalon are arranged to provide maximum reflection at a single desired wavelength.

6. A laser as in claim 2 wherein both the grating and the etalon are arranged to provide maximum reflection at a single very narrow range of desired wavelength.

7. A laser as in claim 2 and further comprising a beam profile comparison means for comparing profiles of light reflected by said etalon and profiles of light transmitted by said etalon.

8. A laser as in claim 2 and further comprising a beam profile comparison means for comparing profiles of light reflected by said etalon to profiles of light incident on said etalon.

9. A laser as in claim 1 wherein said gain medium is laser gas comprised of fluorine, a buffer gas and either krypton or argon, and said laser chamber is comprised of materials which are fluorine compatible.

10. A laser as in claim 1 wherein said output coupler is tunable and further comprising an etalon tuning means.

11. A laser as in claim 1 wherein said etalon has two internal parallel surfaces defining two reflecting surfaces each having reflectances of less than about 20 percent and greater than about 2 percent.

12. A laser as in claim 11 wherein said reflectance are about 4 percent.

13. A laser as in claim 1 wherein said laser is an excimer laser.

14. An excimer laser as in claim 13 wherein said line narrowing unit comprises at least one prism, a grating and a totally reflecting mirror.

15. An excimer laser as in claim 13 wherein said etalon is a pressure-tuned etalon.

16. An excimer laser as in claim 13 wherein said etalon is piezoelectric-tuned etalon.

17. An excimer laser as in claim 13 wherein said etalon is a compression-tuned etalon.

18. An excimer laser as in claim 13 wherein said etalon has two internal parallel surfaces defining two reflecting surfaces each having reflectances of less than 20 percent and greater than about 2 percent.

19. An excimer laser as in claim 18 wherein said reflectances are about 4 percent.

20. An excimer laser as in claim 13 wherein said etalon defines two internal parallel surfaces, both of which are free of any coating.

21. A very narrow band laser comprising:
   A. a laser chamber containing a gain medium,
   B. a line-narrowing unit positioned to accept a portion of the light generated in the laser chamber, narrow its spectrum to produce line-narrowed light, and return it to the laser chamber,
   C. an output coupler comprising tunable etalon defining two internal parallel surfaces having reflectances of less than 20 percent and greater than 2 percent, said output coupler being positioned to reflect a portion of light generated in said laser chamber and to output a portion of the light,
   D. a photo diode array and a first partially reflecting mirror for measuring beam profile of light reflected by said etalon to define a reflected beam profile,
   E. a photo diode array and a second partially reflecting mirror for measuring beam profile of light transmitted by said etalon to define a transmitted beam profile,
   F. a profile processor for comparing said reflected beam profile to said transmitted beam profile to produce comparison data,
   G. an etalon tuner for tuning said etalon based on the comparison data.

22. A very narrow band laser comprising:
   A. a laser chamber containing a gain medium,
   B. a line-narrowing unit positioned to accept a portion of the light generated in the laser chamber, narrow its spectrum to produce line-narrowed light, and return it to the laser chamber,
   C. an output coupler comprising tunable etalon defining two internal parallel surfaces having reflectances of less than 20 percent and greater than 2 percent, said output coupler being positioned to reflect a portion of light generated in said laser chamber and to output a portion of the light, D. a photo diode array and a first partially reflecting mirror for measuring beam profile of light reflected by said etalon to define a reflected beam profile, E. a photo diode array and a second partially reflecting mirror for measuring beam profile of light incident on said etalon to define an incident beam profile, F. a profile processor for comparing said reflected beam profile to said incident beam profile to produce comparison data, G. an etalon tuner for tuning said etalon based on the comparison data.

23. A very narrow band KrF excimer laser comprising:
A. a laser chamber comprised of fluorine compatible materials and containing:
   (1) two elongated electrodes;
   (2) at least one preionizer;
   (3) laser gas defining a total pressure and comprised of krypton, fluorine and a buffer gas, said fluorine having a partial pressure of less than 0.08 of the total pressure,
B. a tunable narrowing unit comprised of:
   (1) at least one beam expanding prism; and
   (2) a tunable grating,
C. an output coupler comprising tunable etalon defining two internal parallel surfaces having reflectances of less than 20 percent and greater than 2 percent, said output coupler being positioned to reflect a portion of light generated in said laser chamber and to output a portion of the light,
D. a photo diode array and a first partially reflecting mirror for measuring beam profile of light reflected by said etalon to define a reflected beam profile,
E. a photo diode array and a second partially reflecting mirror for measuring beam profile of light transmitted by said etalon to define a transmitted beam profile,
F. a profile processor for comparing said reflected beam profile to said transmitted beam profile to produce comparison data,
G. an etalon tuner for tuning said etalon based on the comparison data.

24. A very narrow band KrF excimer laser comprising:
A. laser chamber comprised of fluorine compatible materials and containing:
   (1) two elongated electrodes;
   (2) at least one preionizer;
   (3) laser gas defining a total pressure and comprised of krypton, fluorine and a buffer gas, said fluorine having a partial pressure of less than 0.08 of the total pressure,
B. a tunable narrowing unit comprised of:
   (1) at least one beam expanding prism; and
   (2) a tunable grating,
C. an output coupler comprising tunable etalon defining two internal parallel surfaces having reflectances of less than 20 percent and greater than 2 percent, said output coupler being positioned to reflect a portion of light generated in said laser chamber and to output a portion of the light,
D. a photo diode array and a first partially reflecting mirror for measuring beam profile of light reflected by said etalon to define a reflected beam profile,
E. a photo diode array and a second partially reflecting mirror for measuring beam profile of light incident on said etalon to define a incident beam profile,
F. a processor for comparing said reflected beam profile to said incident beam profile to produce comparison data,
G. an etalon tuner for tuning said etalon based on the comparison data.

25. A method of tuning a very narrow band excimer laser having a gain medium, tunable grating based line narrowing module and a tunable etalon based output coupler wherein a portion of light from said gain medium incident on said output coupler, defining an incident beam, is reflected by said output coupler, said reflected portion defining a reflected beam, and a portion of light from said gain medium is transmitted by said output coupler said transmitted portion defining a transmitted beam; said method comprising the steps of:
A. measuring beam profile of said reflected beam to define a reflected beam profile,
B. measuring the beam profile of said transmitted beam to define a transmitted beam profile,
C. comparing the transmitted beam profile to the reflected beam profile to produce comparison information,
D. tuning the output coupler based on said comparison information.

26. A method of tuning a very narrowed band excimer laser having a gain medium, tunable grating based line narrowing module and a tunable etalon based output coupler wherein a portion of light from said gain medium incident on said output coupler, defining an incident beam, is reflected by said output coupler, said reflected portion defining a reflected beam, and a portion of light from said gain medium is incident by said output coupler said incident portion defining a incident beam; said method comprising the steps of:
A. measuring beam profile of said reflected beam to define a reflected beam profile,
B. measuring the beam profile of said incident beam to define a incident beam profile,
C. comparing the incident beam profile to the reflected beam profile to produce comparison information,
D. tuning the output coupler based on said comparison information.

* * * * *